United States Patent [19]

Harris

[11] 4,204,130

[45] May 20, 1980

[54] MULTICOLLECTOR TRANSISTOR LOGIC CIRCUIT

[75] Inventor: James H. Harris, Danbury, Conn.

[73] Assignee: International Business Machines Corporation, Armonk, N.Y.

[21] Appl. No.: 891,240

[22] Filed: Mar. 29, 1978

[51] Int. Cl.² ............... H01L 27/04; H03K 19/08
[52] U.S. Cl. .......................... 307/215; 307/213; 357/36; 357/44; 357/46; 357/92
[58] Field of Search ............ 357/44, 46, 35, 36; 357/92; 307/213, 215

[56] References Cited

U.S. PATENT DOCUMENTS

| T957,007 | 4/1977 | Jordan et al. | 307/215 |
| 3,312,882 | 4/1967 | Pollock | 357/48 |
| 3,795,822 | 3/1974 | Skokan | 307/215 |
| 3,816,758 | 6/1974 | Berger et al. | 357/92 |

OTHER PUBLICATIONS

Lehning, IEEE J. of Solid State Circuits, vol. SC 9, No. 5, Oct. 1974, pp. 228-233.
Hart et al., Electronics, Oct. 3, 1974, pp. 111-118.
Sylvania Application Note #14, 12/8/67, "Electrical Disposition of Unused SUHL Input.
Hibberd, Integrated Circuits (McGraw-Hill, N.Y., 1969), p. 110.

Primary Examiner—William D. Larkins
Attorney, Agent, or Firm—Theodore E. Galanthay

[57] ABSTRACT

Disclosed is an integrated transistor logic circuit (ITL) comprising complementary bipolar transistors. A PNP transistor injects current into the base of an NPN transistor when this current is not steered away. The base of the PNP transistor and the emitter of the NPN transistor are connected in common to a fixed source of potential. The collector of the NPN transistor is formed in common with the collector regions of one or more output transistors while the base region of the NPN transistor is formed in common with the base regions of the output transistors. The one or more output transistors are operated in the inverted mode providing an output signal at their respective emitter regions.

11 Claims, 3 Drawing Figures

MULTICOLLECTOR TRANSISTOR LOGIC CIRCUIT

DESCRIPTION

Technical Field

This invention relates to an integrated transistor logic circuit comprising complementary bipolar transistors, several of these transistors being operated in an inverted mode.

One object of the present invention is to provide a logic circuit requiring a minimum amount of space in integrated circuit fabrication.

Another object of the present invention is to provide such a dense logic circuit having improved power/performance and noise tolerance characteristics.

Another object of the present invention is to provide an integrated logic circuit with improved yields in integrated circuit form.

Still another object of the present invention is to provide variable power/performance characteristics on the same semiconductor chip.

Lastly, it is an object of this invention to provide an integrated logic circuit with high fan-in and fan-out capabilities.

CROSS REFERENCES TO RELATED PUBLICATIONS AND PATENTS

1. Berger et al, U.S. Pat. No. 3,816,758 issued on June 11, 1974, and assigned to the assignee of the present invention.
2. Berger et al, "Improving Switching Speed Of MTL/I²L Circuitry", IBM Technical Disclosure Bulletin Vol. 19, No. 7, December 1976, Pages 2575–2577.

BACKGROUND ART

In the prior art, a large number of circuit families such as current switch emitter follower logic (CSEF), transistor-transistor-logic (TTL), diode transistor logic (DTL), Schottky barrier diode transistor logic (STL), and current injection logic also known as merged transistor logic (MTL), are all well known. Each of these circuit families is characterized by certain advantageous features at the expense of various tradeoffs. For example, current switch emitter follower logic is extremely fast but consumes a relatively high amount of power. Similarly, Schottky transistor logic (STL) is relatively high speed with relatively high power consumption. STL further suffers from requiring special processes for fabricating the Schottky barrier diodes. Transistor-transistor logic requires less power per circuit at the expense of somewhat lower switching speeds making it particularly advantageous for smaller electronic computing systems. Merged transistor logic has the virtue of very high packing density, lower power consumption/dissipation, and a relatively large fan-out/fan-in logic capability. As a tradeoff, merged transistor logic is characterized by relatively low switching speed (even lower than transistor-transistor logic) due to the requirement of an inversely operated NPN transistor structure and the increased carrier storage resulting from the high saturation of the switched-on NPN transistor. Merged transistor logic is also relatively sensitive to crystalline imperfections such as pipe problems found in integrated circuit structures.

It is thus apparent that there is no single circuit family that provides an ideal solution to every application, but rather various tradeoffs must always be considered. As will become more apparent from the following and more detailed description of my invention, the advantageous aspects of merged transistor logic are retained while further improving performance and fabrication reliability previously associated with higher performance logic circuits such as Schottky barrier diode transistor logic.

BRIEF DESCRIPTION OF THE DRAWING

In the accompanying drawings forming a material part of this disclosure.

DISCLOSURE OF INVENTION

For further comprehension of my invention, and of the objects and advantages thereof, reference will be had to the following description and accompanying drawings, and to the appended claims in which the various novel features of the invention are more particularly set forth.

Figure 1:
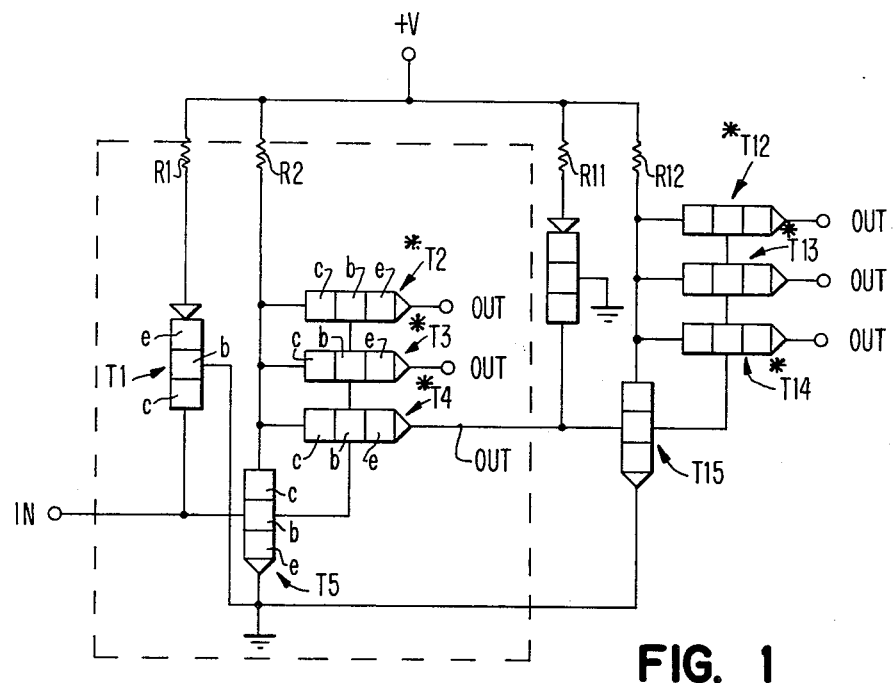
FIG. 1 is a circuit diagram depicting a preferred embodiment of my invention.

As seen in FIG. 1, there is illustrated a transistor logic circuit comprising complementary bipolar transistors, several of these transistors being operated in an inverted mode. Current injection is provided by lateral PNP transistor T1 having emitter (e), base (b), and collector (c), regions. The emitter of transistor T1 (T1e) is connected in series with resistor R1 which, in turn, is connected to a first fixed source of potential +V. The base region of the lateral PNP transistor (T1b) is connected to a second fixed source of potential, such as ground. The collector of the lateral PNP transistor is connected to the input node IN as well as to the base of transistor T5 (T5b). Thus, transistor T1 constantly supplies current to either T5 or to the input node. Current is supplied to T5 when the input node is at an up level; while when the input node is held to a down level current is steered away from T5.

Transistor T5 is a normally operated NPN transistor with its emitter (T5e) connected to ground potential and its base (T5b) connected in common with the base region of transistors T2, T3, and T4. In this specification, the terms emitter and collector are used consistently in their structural sense as designated in semiconductor fabrication. Those skilled in the art will recognize that in the case of inversely operated transistors, the emitter region can functionally be a collector while the collector region can functionally be an emitter. The collector region of transistor T5 (T5c) is connected in common with the collector regions of transistors T2, T3, and T4. An optional resistor R2 may be connected between the common node formed by all the collector regions T2c, T3c, T4c, and T5c and the first fixed source of potential +V. When used, collector resistor R2 acts as a pull-up resistor for the common collector node when T5 is turned off. NPN transistors T2, T3, and T4 operate in the inverted mode and give isolated outputs at their respective emitters T2e, T3e, and T4e. One of the advantageous features of my circuit is the ability to provide any desired fanout (at least ten) capability without deteriorating circuit performance. The only consideration is increased parasitic capacitance. Thus, although transistors T2, T3, and T4 illustrate a fanout of 3, this number has been selected merely for purposes of illustration and not by way of limitation. When transistor T2, T3, and T4 are turned on, they saturate thereby providing no voltage drop. Accordingly, the down level output is brought near ground potential. This is a significant advantage over diode connections which always have a forward voltage drop. Thus, my circuit also has a higher tolerance to noise and is fabricatable with conventional semiconductor processes. No exotic processing techniques of the type required for SBD's are required to fabricate my circuit.

The circuit within dash lines in FIG. 1 completely illustrates an exemplary cell in accordance with my invention. The remainder of the circuit components are a duplication illustrating the next cell in an overall logic network. Thus, resistors R11 and R12 correspond to resistors R1 and R2, respectively. Lateral PNP transistor T11 corresponds to T1 while NPN transistor T15 corresponds to T5. Lastly, inversely operated NPN transistors T12, T13, and T14 correspond to previously described transistors T2, T3, and T4 respectively. It is again noted that even though the fanout of three is also shown in the second cell, there is no requirement that the same fanout be maintained for both cells. In fact, it may be advantageous in an overall network to have cells with varying fanout capabilities.

Figure 2:
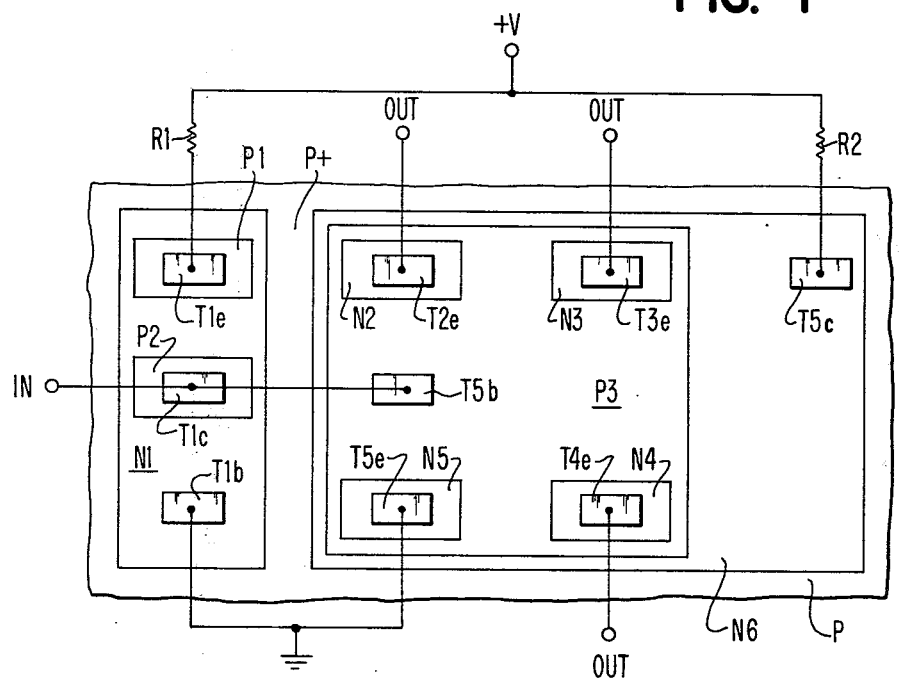
FIG. 2 is a top view of an exemplary horizontal arrangement of my invention in integrated circuit form.

In FIG. 2, the circuitry within dashed lines in FIG. 1 is illustrated in integrated circuit form. Lateral PNP transistor T1 is generally illustrated on the left while the NPN transistors are generally illustrated on the right hand side of FIG. 2. The ohmic emitter contact of transistor T1 is illustrated as T1e in the highly doped P region P1. The ohmic collector contact T1c is formed in the highly doped P region P2. The active base area of lateral PNP transistor T1 is the N type bed into which regions P1 and P2 were formed and the ohmic base contact T1b is formed into a highly doped portion of this N type bed, as is well known in integrated circuit fabrication.

Resistor R1 connected between T1e and +V is formed externally to the chip permitting its value to be selected for particular applications. For example, a relatively low value for resistor R1 will provide a higher current flow increasing switching speed as well as power consumption. If lower power consumption and resultant lower heat dissipation are desired, a higher value can be selected for the resistance of R1, thereby, however, achieving a lower switching speed. Of course, if it is desired, resistor R1 can be formed on the chip by known processes.

As is well known in semiconductor integrated circuit fabrication, a P type wafer customarily has an N type epitaxial layer formed thereon and a buried N+ subcollector region. In FIG. 2, regions N1 and N6 are such an N type epitaxial region formed on a P type substrate. Regions N1 and N6 form first and second regions separated by the P+ type isolation zone. In the fabrication of NPN transistors T2, T3, T4, and T5, a P type diffusion or ion implant is formed within this N type epitaxial layer N6. This P type doped region P3 forms the base region for transistors T2, T3, T4, and T5. An ohmic contact to this region P3 is the base contact for T5, designated as T5b, and is connected to the collector (T1c) of transistor T1 and the input terminal. Highly doped N type regions N2, N3, N4, and N5 are formed in P3 and the resultant ohmic contacts form the emitter electrodes for emitters T2e, T3e, T4e, and T5e. The emitter (T5e) of transistor T5 and the base (T1b) of transistor T1 are connected in common and to ground potential while T2e, T3e, and T4e, provide the respective outputs. A P+ type isolation region separates the NPN transistors from the PNP transistor T1.

The N type epitaxial region N6 forms the common collector for transistors T2, T3, T4, and T5 and ohmic contact is made at collector contact T5c. Optional collector resistor R2 is connected between +V and the collector contact T5c. Those skilled in the semiconductor integrated circuit fabrication art will recognize that the layout of FIG. 2 is exemplary and various other arrangements will also provide the FIG. 1 circuit. For example, resistor R2 can also be formed either externally or in integrated form. In integrated form it is convenient to form resistor R2 as an N type resistance between the collector contact and the N+ subcollector region. In the event R2 is not used at all, no collector contacts to the potential +V is required. The fabrication processes known from merged transistor logic may be utilized in the fabrication of my circuit.

Figure 3:
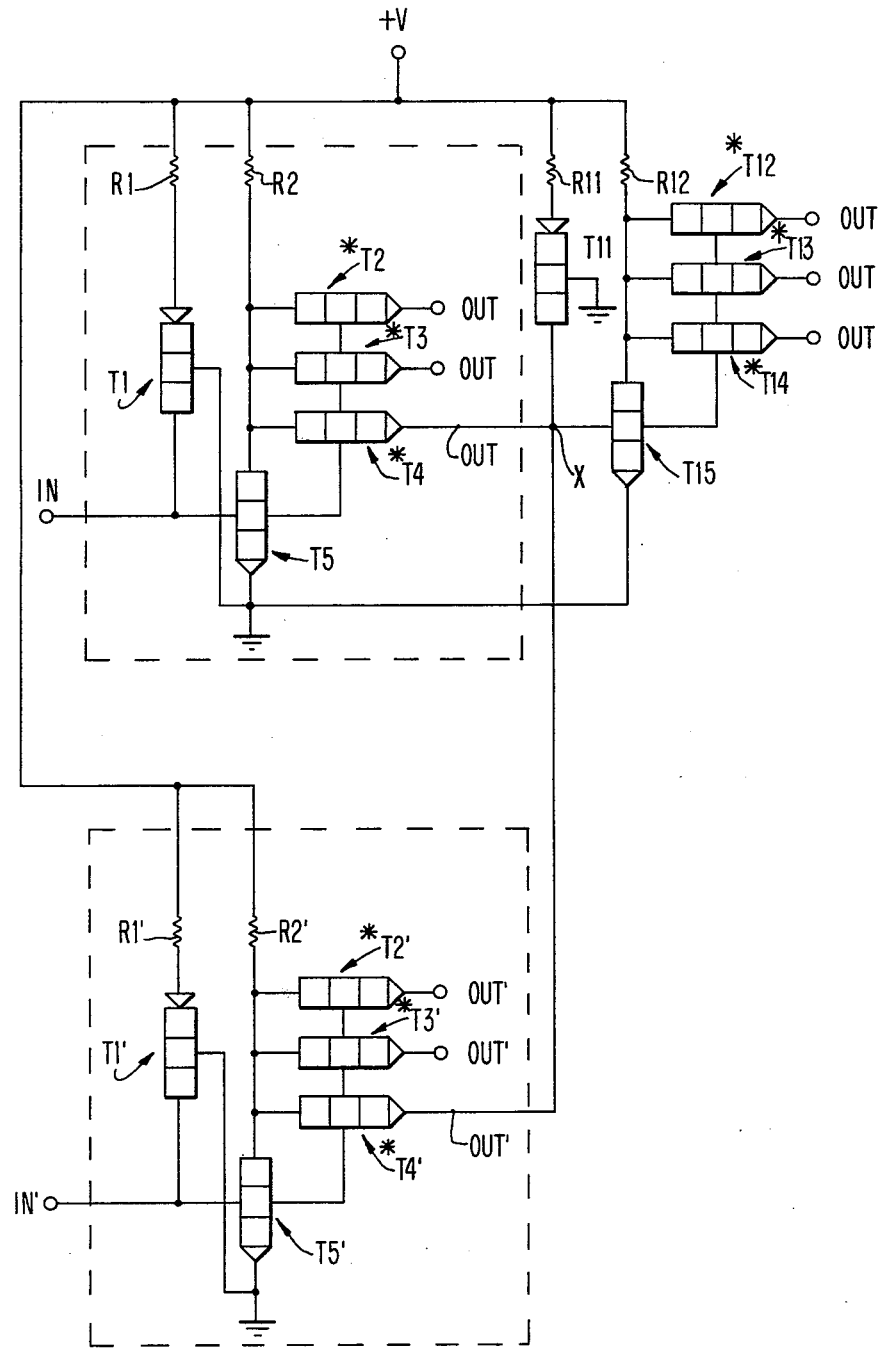
FIG. 3 is a circuit diagram illustrating the wired logic capability of my invention.

Refer now to FIG. 3 which illustrates the wired logic capability of my invention. Wired logic, also referred to as "DOT logic", is a known advantageous feature in switching networks. For purposes of explanation and illustration, FIG. 1 has been reproduced in its entirety as a portion of the FIG. 3 network. Corresponding elements have been correspondingly referenced. The emitter (e), base (b), and collector (c), designations have been omitted. A second identical cell is illustrated in the network of FIG. 3 with corresponding elements designated by prime notation. The "DOT logic" capability of the circuit is designated at node X where the outputs of transistor T4 and transistor T4' are shown connected in common and forming an input node to the base of transistor T15.

By way of exemplary operation, when the input signal at the input node is at a "down" logic level, the current supplied by T1 is steered away from T5 causing T5 to be turned off. When T5 is off, inversely operated transistors T2, T3, and T4 are also off. As illustrated in FIG. 1, as well as FIG. 3 when T4 is off, the current supplied by transistor T11 is not steered away, but rather supplied to transistor T15 turning transistor T15 on. When T15 is on and saturates, its collector is brought to a down level while the common connected bases of T12, T13, and T14 are maintained at an up level. This causes transistors T12, T13, and T14 to saturate and conduct in the inverse direction providing a down level at their respective output terminals. Conversely, when the input terminal at the base of T5 is brought to an up level then the current supplied by T1 turns T5 on. When T5 is on and saturates, its collector (as well as the common collectors of T2, T3, and T4) are at a down level while the bases of T2, T3, and T4 are at an up level causing them to saturate and conduct in the inverse mode. This brings the respective emitter outputs to a down level. Accordingly, current supplied by T11 is steered away from the base of T15 turning it off. When T15 is off, T12, T13, and T14 are also off so that their respective outputs will not steer current away from the input of the next stage.

Assuming a potential difference between +V and ground in the order of 1.0 volts, a voltage swing of 0.4 volts will provide the desired signal propagation through a logic network. In the last mentioned example when the input terminal to the base of T5 was brought to an up level, as soon as T5 approached saturation, T2, T3, and T4 were turned on to operate in the inverse mode. T5 being on maintained its collector and the other common collector regions at a down level resulting in some current flow through resistor R2, in the case where this optional resistor is utilized. In exchange for this undesired power dissipation, resistor R2 contributes in charging the common collector regions of T2, T3, T4 and T5 to an up level as soon as T5 is turned off, thereby causing T2, T3, and T4 to turn off faster. It is noted that without collector resistor R2, as soon as the input terminal is brought to a down level transistors T2, T3, and T4 as well as transistor T5 are turned off, leaving the common collector region to float.

In the absence of R2, when the input terminal is brought to an up level, transistor T5 saturates bringing the collector of T5 near ground potential causing transistors T2, T3, and T4 to also saturate thereby steering current away from the input node of the next subsequent stage. Thus, there is no change in the performance of the circuit in this transition. When the input terminal goes down, however, and T5 is cut off, transistors T2, T3, and T4 require a longer time to cut off. Thus, resistor R2 improves the performance of the circuit during the transition when the input terminal is brought to a logical down level.

As has been pointed out, my circuit provides variable performance capabilities when R1 is provided as an external resistor. Of course, it is also well known to integrate resistor R1 as a P type diffused or ion implanted resistor. Moreover, it is the combined function of resistor R1 and transistor T1 to inject current into the base of transistor T5. This current injection could be performed by a resistor alone without the need for lateral PNP transistor T1.

As previously mentioned, an important feature of my invention is the reliability improvement occasioned by an insensitivity to pipe limited yields (also known as leakage limited yields). These defects are known from merged transistor logic and usually occur in the inversely operated transistors. More particularly, when an emitter region such as T2e, T3e, or T4e becomes the collector of the transistor in the inverse operating mode, a short circuit or high resistance leakage path can occur through the base region. In my circuit, such a short circuit or resistive leakage paths in one or more of transistors T2, T3, and T4 has no affect on the circuit operation. For example, assume that T4 has a leakage path through its base region. In such a case, when T5 is on, current would be steered away from the base of T15. Similarly, when T5 is off, current would not be steered away from the base of T15. Thus, the pipe defect is of no consequence. A similar insensitivity results in the case of T2 and T3 as well as in the case when all 3 output transistors simultaneously have pipe problems.

It is noted that even a normally operated transistor such as T5 can develop pipe defects. Assume a short circuit path through the base of transistor T5. In the case when the input terminal is at a down level, T2, T3, and T4 would be held off preventing current from being steered away from the next subsequent input stage. On the other hand, when the input terminal is at an up level, T2, T3, and T4 would conduct steering the current away from the next subsequent stage. It is therefore concluded that my circuit is also insensitive to pipe problems in transistor T5.

In the event that the transistor T5 has a pipe problem and one or more of transistors T2, T3, and T4 also have a pipe problem, then my circuit is affected. In the event these pipe problems are short circuits, the circuit will not operate. If these pipe problems, however, are high resistance leakage paths, then it is possible that the difference between the on and off states of the series connection of T5 and the other affected transistors is sufficient to cause a logical switching level at the next subsequent stage. For example, if both T4 and T5 have a pipe problem and at least one of them is not a short circuit, then the difference between the current steered away from the base of transistor T15 during the up and down levels of the input terminal at the base of T5 determines whether the circuit can operate. It must here be pointed out that statistically it is highly unlikely for both transistor T5 and one of the other transistors T2, T3, and T4 to have simultaneous pipe problems.

As previously mentioned, FIG. 3 illustrates the DOT logic capability of my circuit. The individual circuits within the network of FIG. 3 operate as previously described. Since the output of both transistor T4 and transistor T4' are connected at node X, either one of these transistors is capable of bringing node X near ground potential. Thus, if either the input terminal IN or the input terminal IN' are brought to an up level, the corresponding one of transistors T5 or T5' saturates, turning on the corresponding one of transistors T4 and T4' bringing node X near ground potential. As long as either or both inputs are at an up level, node X will be brought to a down level. Both the input terminals must be maintained at a down potential in order to provide an up level at node X resulting in current injection into the base of transistor T15. This logic function provided at node X is commonly referred to as a NOR function.

While I have illustrated and described the preferred embodiments of my invention, it is to be understood that I do not limit myself to the precise constructions herein disclosed and the right is reserved to all changes and modifications coming within the scope of the invention as defined in the appended claims.

Having thus described my invention, what I claim as new, and desire to secure by letters Patent is:

1. An integrated transistor logic arrangement including at least first and second logic circuits, each of said first and second logic circuits comprising:
   first and second power supply terminals;
   a first transistor having first and second regions of first conductivity type separated by a third region of second conductivity type;
   a plurality of second transistors, each having fourth and fifth regions of first conductivity type separated by a sixth region of second conductivity type;
   the fourth regions of said second transistors being electrically connected in common with the second region of said first transistor, the sixth regions of said second transistors being electrically connected in common with the third region of said first transistor;
   the first region of said first transistor being electrically connected to said first power supply terminal;
   circuit means for supplying current from said second power supply terminal to the commonly connected third region of said first transistor and the sixth regions of said second transistors;
   the commonly connected third region of said first transistor and sixth regions of said second transistors being the input of the logic circuit, the fifth regions of said second transistors being outputs of the logic circuit;
   the first and second power supply terminals of the first logic circuit being connected in common with the first and second power supply terminals of the second logic circuit, respectively; and, the input of the second logic circuit being connected to one of the outputs of the first logic circuit.

2. An integrated transistor logic arrangement as in claim 1 wherein said circuit means for supplying current comprises:

a third transistor having seventh and eighth regions of second conductivity type separated by a ninth region of first conductivity type;

the seventh region being electrically connected to the second power supply terminal, the eighth region being connected to the commonly connected third region of said first transistor and the sixth regions of said second transistors; and the ninth region of said third transistor being electrically connected to the first power supply terminal.

3. An integrated transistor logic arrangement as in claim 2 wherein the electrical connection between the seventh region of the third transistor and the second power supply terminal comprises a resistive element.

4. An integrated transistor logic arrangement as in claim 2 wherein said first and plurality of second transistors are NPN transistors, said third transistor being a PNP transistor, said first conductivity type being N type, said second conductivity type being P type.

5. An integrated transistor logic arrangement as in claim 1 additionally comprising:

a resistive connection between said second power supply terminal and the electrical connection between the second region of the first transistor and the fourth regions of the plurality of second transistors.

6. An integrated transistor logic circuit comprising:

circuit means, including an input node, for injecting current into a base of a first transistor having first and second regions of a first conductivity type and a base region therebetween of a second conductivity type;

at least a second transistor having first and second regions of said first conductivity type and a base region therebetween of said second conductivity type;

the base region of said first transistor being electrically connected to the base region of said at least second transistor and the second region of said first transistor being electrically connected to the second region of said at least second transistor;

the first region of said at least second transistor forming an output;

said first conductivity type regions being N type, said second conductivity type regions being P type such that said first and second transistors are NPN transistors;

said circuit means including a lateral PNP transistor connected in series with a resistor for injecting current into the base of said at least first transistor;

a first source of fixed potential;

a second resistor connected between said first source of fixed potential and the common second regions of said first and at least second transistor;

a second source of fixed potential more negative in potential level than said first source of fixed potential, electrically connected to the first region of said first transistor.

7. An integrated transistor logic arrangement including at least first and second logic circuits, each of said first and second logic circuits comprising:

first and second power supply terminals;

a first transistor having first and second regions of first conductivity type separated by a third region of second conductivity type;

at least one second transistor having fourth and fifth regions of first conductivity type separated by a sixth region of second conductivity type;

the fourth region of said second transistor being electrically connected in common with the second region of said first transistor, the sixth region of said second transistor being electrically connected in common with the third region of said first transistor;

the first region of said first transistor being electrically connected to said first power supply terminal;

circuit means for supplying current from said second power supply terminal to the commonly connected third region of said first transistor and the sixth region of said second transistor;

the commonly connected third region of said first transistor and sixth region of said second transistor being the input of the logic circuit, the fifth region of said second transistor being the output of the logic circuit;

the first and second power supply terminals of the first logic circuit being connected in common with the first and second power supply terminals of the second logic circuit, respectively; and, the input of the second logic circuit being connected to the output of the first logic circuit.

8. An integrated transistor logic arrangement as in claim 7 wherein said circuit means for supplying current comprises:

a third transistor having seventh and eighth regions of second conductivity type separated by a ninth region of first conductivity type;

the seventh region being electrically connected to the second power supply terminal, the eighth region being connected to the commonly connected third region of said first transistor and the sixth region of said second transistor; and the ninth region of said third transistor being electrically connected to the first power supply terminal.

9. An integrated transistor logic arrangement as in claim 8 wherein the electrical connection between the seventh region of the third transistor and the second power supply terminal comprises a resistive element.

10. An integrated transistor logic arrangement as in claim 8 wherein said first and second transistors are NPN transistors, said third transistor being a PNP transistor, said first conductivity type being N type, said second conductivity type being P type.

11. An integrated transistor logic arrangement as in claim 7 additionally comprising:

a resistive connection between said second power supply terminal and the electrical connection between the second region of the first transistor and the fourth region of the second transistor.

* * * * *